(12) United States Patent
Bichler et al.

(10) Patent No.: US 9,189,732 B2
(45) Date of Patent: Nov. 17, 2015

(54) METHOD FOR NON-SUPERVISED LEARNING IN AN ARTIFICIAL NEURAL NETWORK BASED ON MEMRISTIVE NANODEVICES, AND ARTIFICIAL NEURAL NETWORK IMPLEMENTING SAID METHOD

(75) Inventors: Olivier Bichler, Massy (FR); Christian Gamrat, Les Ulis (FR); Damien Querlioz, Sceaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 193 days.

(21) Appl. No.: 14/126,397

(22) PCT Filed: Jun. 27, 2012

(86) PCT No.: PCT/EP2012/062420
§ 371 (c)(1),
(2), (4) Date: Dec. 13, 2013

(87) PCT Pub. No.: WO2013/000939
PCT Pub. Date: Jan. 3, 2013

(65) Prior Publication Data
US 2014/0129498 A1 May 8, 2014

(30) Foreign Application Priority Data
Jun. 30, 2011 (FR) ..................... 11 55854

(51) Int. Cl.
*G06N 3/06* (2006.01)
*G06N 3/08* (2006.01)
*G06N 3/04* (2006.01)
*G06N 3/063* (2006.01)

(52) U.S. Cl.
CPC ................ *G06N 3/088* (2013.01); *G06N 3/049* (2013.01); *G06N 3/063* (2013.01); *G06N 3/08* (2013.01)

(58) Field of Classification Search
None
See application file for complete search history.

(56) References Cited

U.S. PATENT DOCUMENTS

2010/0299296 A1  11/2010  Mohda et al.
2010/0299297 A1  11/2010  Breitwisch et al.

FOREIGN PATENT DOCUMENTS

FR          2919410 A1     1/2009

OTHER PUBLICATIONS

Galtier, A mathematical approach to unsupervised learning in recurrent neural networks, Doctoral Thesis, l'Ecole nationale superieure des mines de Paris, 2011, pp. 1-278.*
O. Bichler et al., "Unsupervised Features Extraction from Asynchronous Silicon Retina through Spike-Timing-Dependent Plasticity", Neural Networks, Jul. 2011, pp. 859-866.
D. Kuzum et al., "Nanoelectronic Programmable Synapses Based on Phase Change Materials for Brain-Inspired Computing", Nano Letters, Mar. 2011, 8 pages.
G. Snider, "Spike-Timing-Dependent Learning in Memristive Nanodevices", IEEE ACM International Symposium on Nanoscale Architectures, 2008, pp. 85-92.

(Continued)

*Primary Examiner* — Wilbert L Starks
(74) *Attorney, Agent, or Firm* — Baker & Hostetler LLP

(57) ABSTRACT

An unsupervised learning method is provided implemented in an artificial neural network based on memristive devices. It consists notably in producing an increase in the conductance of a synapse when there is temporal overlap between a pre-synaptic pulse and a post-synaptic pulse and in decreasing its conductance on receipt of a post-synaptic pulse when there is no temporal overlap with a pre-synaptic pulse.

16 Claims, 11 Drawing Sheets

(56) References Cited

OTHER PUBLICATIONS

D. Chabi et al., "Robust Neural Logic Block (NLB) based on Memristor Crossbar Array", IEEE ACM International Syposium on Nanoscale Architectures, 2011, pp. 137-143.

G. Agnus et al., "Carbon Nanotube-Based Programmable Devices for Adaptive Architectures", IEEE International Symposium on Circuits and Systems, May 2010, pp. 1667-1670.

International Search Report dated Nov. 8, 2012, for International Patent Application No. PCT/EP2012/062420.

* cited by examiner

METHOD FOR NON-SUPERVISED LEARNING IN AN ARTIFICIAL NEURAL NETWORK BASED ON MEMRISTIVE NANODEVICES, AND ARTIFICIAL NEURAL NETWORK IMPLEMENTING SAID METHOD

CROSS-REFERENCE TO RELATED APPLICATIONS

This application is a National Stage of International patent application PCT/EP2012/062420, filed on Jun. 27, 2012, which claims priority to foreign French patent application No. FR 1155854, filed on Jun. 30, 2011, the disclosures of which are incorporated by reference in their entirety.

FIELD OF THE INVENTION

The invention relates to the field of artificial neural networks and more particularly spiking neural networks. These networks are schematically inspired by the biological neural networks whose operation they imitate.

The invention also relates to the field of unsupervised learning methods, that is to say automatic learning allowing the extraction of knowledge organized on the basis of real or simulated data. The data considered to be the most similar are assembled into one and the same group whilst the data considered to be different are distributed into distinct groups.

More precisely, the invention also relates to methods of unsupervised extraction of temporally correlated and repetitive events, on the basis of a non-organized sequence of events.

The invention relates finally to the implementation of artificial neural networks in the form of electronic circuits designed with the aid of memristive devices.

BACKGROUND

Artificial neural networks are composed essentially of neurons mutually interconnected by synapses, which are conventionally implemented by digital memories, but which can also be implemented by resistive components whose conductance varies as a function of the voltage applied across their terminals.

A learning rule conventionally used by the spiking neural networks is the STDP ("Spike Timing Dependent Plasticity") rule. This is a biologically inspired rule whose objective is to reproduce the operation of the learning carried out by biological neurons and synapses. In order for such a rule to be implemented, the conductance of the synapses must vary as a function of the relative instants of arrival of the pre and post synaptic spikes (or pulses) transmitted by the neurons connected respectively at input and at output. According to the STDP rule, the conductance of a synapse is increased if its post synaptic neuron is activated after its pre synaptic neuron and decreased in the converse case. Furthermore, the variation in conductance also depends on the precise lag between the pulses that are generated subsequent to the activation of the neurons. Typically the more significant the lag, the less the conductance will vary.

The STDP learning rule exhibits certain limitations when a real implementation of an artificial neural network is envisaged. Firstly, a biologically inspired learning rule is not necessarily suited to concrete applications; furthermore it turns out to be complex to implement since the conductance variation characteristics of the devices used to embody the artificial synapses are not always compatible with an exact modeling of the biological learning rule.

The state of the art of spiking neural networks essentially comprises solutions which are aimed at proposing an implementation of the STDP learning rule. It is possible to cite for example the publications D. Kuzum, R. G. D. Jeyasingh, B. Lee, and H.-S. P. Wong, "*Nanoelectronic Programmable Synapses Based on Phase Change Materials for Brain-Inspired Computing,*" *Nano Letters,* 2011 and Snider, G. S. (2008). "*Spike-timing-dependent learning in memristive nanodevices*". *IEEE International Symposium on Nanoscale Architectures* 2008 *NANOARCH* 2008.

Patent applications US 2010/0299296 and US 2010/0299297 which describe an implementation of the STDP rule on the basis of unipolar devices of PCM type are also known.

SUMMARY OF THE INVENTION

The present invention proposes an unsupervised learning method implemented in an artificial neural network based on memristive devices.

In contradistinction to the learning methods of the prior art, the invention is not aimed at the modeling of the STDP biological rule and proposes an implementation which is less complex to carry out for practical applications. The method according to the invention does not make it necessary to devise sophisticated forms of pulses and the constraints on the instants of arrival of the pre and post synaptic pulses are also relaxed with respect to the known solutions.

The subject of the invention is thus a method of unsupervised learning in an artificial neural network comprising a plurality of artificial neurons mutually interconnected by means of artificial synapses characterized in that it comprises at least the following steps:

Generating, in at least one first neuron, called an input neuron, a pre-synaptic pulse and propagating it to the synapses to which it is directly connected downstream, Propagating the pre-synaptic pulse, weighted by the conductance of said synapses, to the neurons to which they are directly connected downstream, called output neurons, Integrating, in the output neurons, said pulses and comparing the result with a predetermined activation threshold, When said activation threshold is exceeded, activating the output neuron, generating, in this neuron, a post-synaptic pulse and retro-propagating it to the synapses to which it is directly connected upstream, When there is temporal overlap, at the level of a synapse, between a pre-synaptic pulse and a post-synaptic pulse, increasing the conductance of said synapse, When a synapse receives a post-synaptic pulse and there is no temporal overlap with a pre-synaptic pulse, decreasing its conductance.

In a variant embodiment, the method according to the invention furthermore comprises the following steps:

Generating, in at least one first input neuron, an activation pulse, propagating it to the synapses to which it is directly connected downstream and activating said input neuron for a predetermined duration, the amplitude of the activation pulse being configured so as not to cause appreciable variation in the conductance of said synapses, When the activation threshold of an output neuron is exceeded, informing all the input neurons of the activation of said output neuron and generating consecutively, in the active input neurons, a pre-synaptic pulse.

In another variant embodiment, the method according to the invention furthermore comprises the following step: when the integration threshold of an output neuron is exceeded, deactivating the synapses directly connected to the other output neurons, by disconnecting one of the terminals of said synapses (111,141) or by imposing an infinite impedance on it.

The subject of the invention is also a neural network comprising a plurality of artificial neurons, each input neuron being connected to each output neuron by way of an artificial synapse, said network being characterized in that it is suitable for implementing the unsupervised learning method as claimed in claim 1.

In a variant embodiment of the invention, an artificial synapse is embodied by a bipolar memristive device whose conductance increases when the voltage across its terminals is biased in one direction, decreases when the voltage across its terminals is biased in the opposite direction and remains substantially constant when the voltage across its terminals exhibits an amplitude lying between a first threshold $V_{th-}$ of negative polarity and a second threshold $V_{th+}$ of positive polarity.

In a variant embodiment of the invention, a pre-synaptic pulse has an amplitude $V_{PRE}$ of constant polarity, a post-synaptic pulse consists of a first pulse of predetermined amplitude $V_{P+}$ followed by a pulse of amplitude $V_{P-}$ of opposite polarity to that of the first pulse, said pulses being configured so as to comply with the following two inequalities:

$$|V_{PRE}-V_{P-}|>|V_{th+}| \text{ and } |V_{PRE}-V_{P+}|<|V_{th-}|$$

$$|V_{P+}|>|V_{th-}| \text{ and } |V_{P-}|<|V_{th+}|$$

In a variant embodiment of the invention, an artificial synapse is embodied by a unipolar memristive device whose conductance increases when the voltage across its terminals is above a first predetermined threshold $V_{th+}$ and included in a first amplitude span, decreases when the voltage across its terminals is above a second threshold $V_{th-}$ and included in a second amplitude span and remains substantially constant when the voltage across its terminals exhibits an amplitude that is lower than the smaller of the two thresholds $V_{th-}$, $V_{th+}$.

In a variant embodiment of the invention, a post-synaptic pulse has an amplitude $V_P$ of negative polarity and that:

When said first threshold $V_{th+}$ is less than said second threshold $V_{th-}$, a pre-synaptic pulse has an amplitude $V_{PRE}$ of negative polarity, said pulses being configured so as to comply with the following two inequalities:

$$|V_{PRE}-V_P|>|V_{th+}| \text{ and } |V_{PRE}-V_P|<|V_{th-}|$$

$$|V_P|>|V_{th-}|$$

When said first threshold $V_{th+}$ is greater than said second threshold $V_{th-}$, a pre-synaptic pulse has an amplitude $V_{PRE}$ of positive polarity, said pulses being configured so as to comply with the following three inequalities:

$$|V_{PRE}-V_P|>|V_{th+}|$$

$$|V_P|>|V_{th-}| \text{ and } |V_P|<|V_{th+}|$$

In a variant embodiment of the invention, the amplitude $V_{PRE}$ of the pre-synaptic pulse is substantially equal to the difference of said first and second thresholds $V_{th+}-V_{th-}$.

In a variant embodiment, the network according to the invention furthermore comprises feedback means linking the set of output neurons to the set of input neurons, said means being suitable for informing each input neuron of the activation of at least one output neuron, said network being furthermore suitable for implementing the unsupervised learning method according to an embodiment of the invention.

In a variant embodiment, the network according to the invention furthermore comprises means suitable, when the integration threshold of an output neuron is exceeded, for deactivating the synapses directly connected to the other output neurons, said network being furthermore suitable for implementing the unsupervised learning method according to an embodiment of the invention.

In a variant embodiment of the invention, said deactivation means consist of:
An OR logic gate linked on its first input to the output of an output neuron and on its second, complemented, input to the output of said feedback means,
a field-effect transistor paired with each artificial synapse and mounted so that its drain is connected to the input terminal of said synapse, its source is connected to the communicating junction which links said synapse to an input neuron and its gate is connected to the output of said OR logic gate.

In a variant embodiment, the network according to the invention furthermore comprises a diode mounted in series with each artificial synapse and configured so that said first and second thresholds $V_{th+}$, $V_{th-}$ are increased by the threshold voltage of the diode $V_d$.

In a variant embodiment of the invention, the memristive devices are of CBRAM, OXRAM, PCRAM or PCM type.

The subject of the invention is also a method for detecting temporally correlated sequences in a data stream, characterized in that an asynchronous stream of pulses is generated on the basis of said data stream and produced as input to an artificial neural network implementing the learning method according to the invention, the activation of an output neuron corresponding to the detection of a sequence.

The subject of the invention is also the use of the detection method according to the invention to extract and classify temporally correlated sequences within audio, image, video or biological data.

BRIEF DESCRIPTION OF THE DRAWINGS

Other characteristics and advantages of the invention will become apparent with the aid of the description which follows offered in relation to appended drawings which represent.

DETAILED DESCRIPTION

Figure 1:
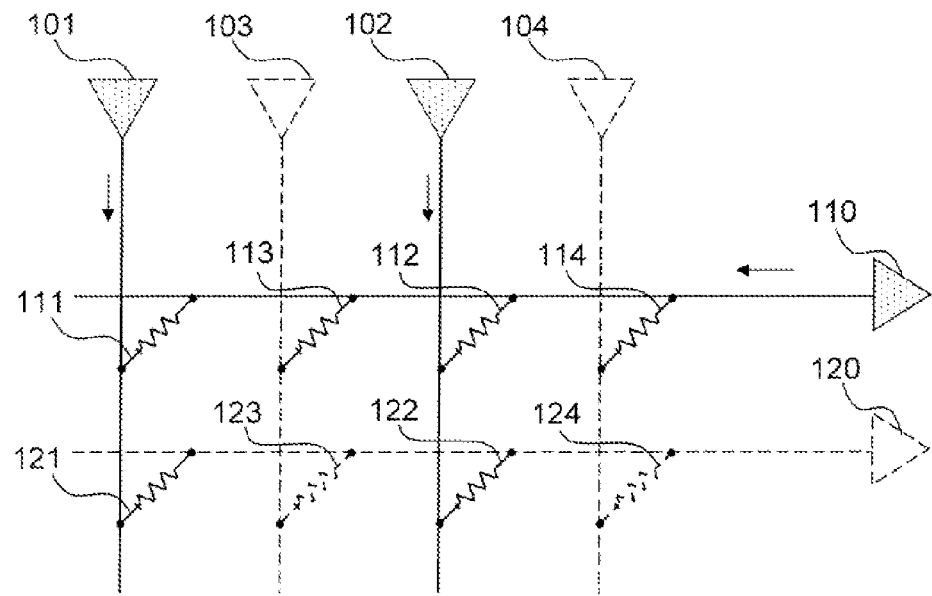
FIG. 1, a functional schematic of an artificial neural network according to a first embodiment of the invention, FIG. 2, a diagram of a practical exemplary embodiment of a matrix of synapses making it possible to embody an artificial neural network according to the invention, FIG. 3, a functional schematic of an artificial neural network according to a second embodiment of the invention, FIGS. 4a and 4b, two charts representing the variation in conductance of a bipolar memristive nano-device as a function of the voltage applied across its terminals, FIGS. 5a and 5b, two charts representing the variation in conductance of a unipolar memristive nano-device as a function of the voltage applied across its terminals, FIG. 6a, an illustration of the principle of learning in a neural network by application of an STDP biological rule, FIG. 6b, a chart representing the theoretical variation in the conductance of a synapse according to the STDP biological rule, FIG. 7, a flowchart showing diagrammatically the steps for implementing the learning method according to the invention, FIG. 8, a chart representing the shape of the various pulses generated by the artificial neurons to implement the learning method according to the invention in the case where the artificial synapses are bipolar memristive nano-devices, FIGS. 9a and 9b, two charts representing the shape of the various pulses generated by the artificial neurons to implement the learning method according to the invention in the case where the artificial synapses are unipolar memristive nano-devices, FIG. 10, a flowchart showing diagrammatically the steps for implementing the learning method according to the second embodiment of the invention, FIG. 11, a diagram illustrating an application of the unsupervised learning method according to the invention to the detection of the trajectories followed by a mobile object moving in a plane, FIGS. 12 and 13, two charts representing the instants of activation of the output neurons as a function of the trajectory followed by the object, before and after convergence of the learning method according to the invention.

FIG. 1 represents a functional schematic of an artificial neural network according to a first embodiment of the invention.

A plurality of input neurons 101,102,103,104 are connected to a plurality of output neurons 110,120 by way of a plurality of artificial synapses 111,112,113,114,121,122,123, 124. An artificial synapse is embodied by means of a memristive device whose conductance varies as a function of the current or of the voltage applied across its terminals. A synapse 111 has one of its terminals connected to an input neuron 101 and the other terminal connected to an output neuron 110. An artificial neuron is an active component which can exhibit the input neuron and/or output neuron functions simultaneously or separately. An artificial neuron is called an input neuron when it is connected downstream to a synapse and an output neuron when it is connected upstream to a synapse. The artificial neurons can be active or inactive. In FIG. 1, by way of example, the input neurons 101,102 are considered active and the input neurons 103,104 inactive. Likewise the output neuron 110 is active whereas the output neuron 120 is inactive. A neuron is active when at the instant considered, it emits a pulse. The duration of its "active" state can be predetermined. The schematic of FIG. 1 represents a wholly non-limiting example of a simple neural network comprising solely neurons exhibiting just one of the two neuron functions, input or output. One speaks in this case of a single layer neural network. Without departing from the scope of the invention, a neural network can also consist of several layers, that is to say the output neurons 110,120 can themselves be connected to a second neural network and represent input neurons for this second network. Likewise the input neurons 101,102,103,104 can be output neurons for another network to which they might be connected.

Figure 2:
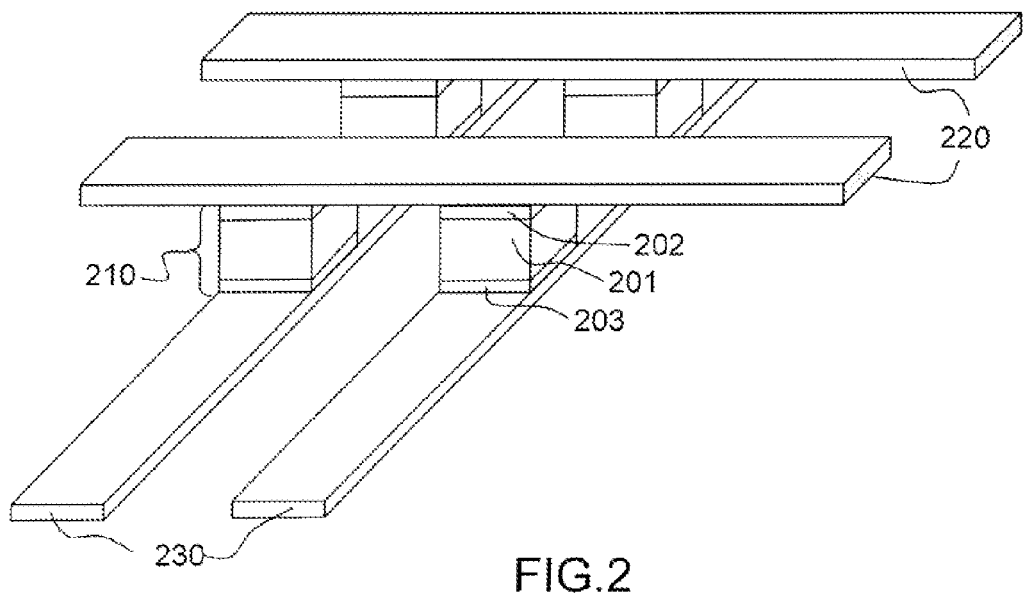

FIG. 2 illustrates on a diagram, a practical exemplary embodiment for implementing the synapses of a neural network of FIG. 1 using memristive devices.

A memristive device is an electronic component with two terminals which behaves as a resistance or a conductance, whose value changes dynamically with the application of a current or of a voltage across its terminals. A device of this type can be characterized by the following equations:

$$i = G \cdot v$$

$$\frac{dG}{dt} = f(v, G)$$

where G is the conductance of the device which links its input current i to the voltage across its terminals v.

A family of memristive devices that is particularly suited to the production of artificial synapses in a neural network is that for which the characteristic f(v,G) is nonlinear. Among these families may be cited in particular the devices of MIM (Metal-Insulator-Metal) type which constitute the base cell of several technologies of nonvolatile memories such as RRAMs "Resistive Random Access Memories" and CBRAMs "Conductive-Bridging RAMs".

An artificial neural network can be embodied, as illustrated in FIG. 2, by using such memristive devices in the guise of artificial synapses and by integrating them into a structure of "crossbar" type. A synapse 210 is embodied by an insulant 201, of oxide, solid electrolyte or organic material type, flanked by two electrodes 202,203. One of the electrodes 202 is linked to a first metal layer 220 and the other electrode 203 is linked to a second metal layer 230. The two metal layers 220,230 are arranged so as to form mutually parallel metal strips. A metal strip of one of the two metal layers makes it possible to link an output neuron to a plurality of input neurons by way of a plurality of synapses. Likewise a metal strip of the second layer makes it possible to link an input neuron to a plurality of output neurons by way of a plurality of synapses.

FIG. 2 illustrates a simple example of a practical embodiment of an artificial neural network. Without departing from the scope of the invention, the structure of such a network can be more complex. In particular the two metal layers 220,230 are not necessarily planar and can take the form of more complex structural embodiments while offering the same functionality which is to embody a communicating junction between the synapses and the neurons.

Figure 3:
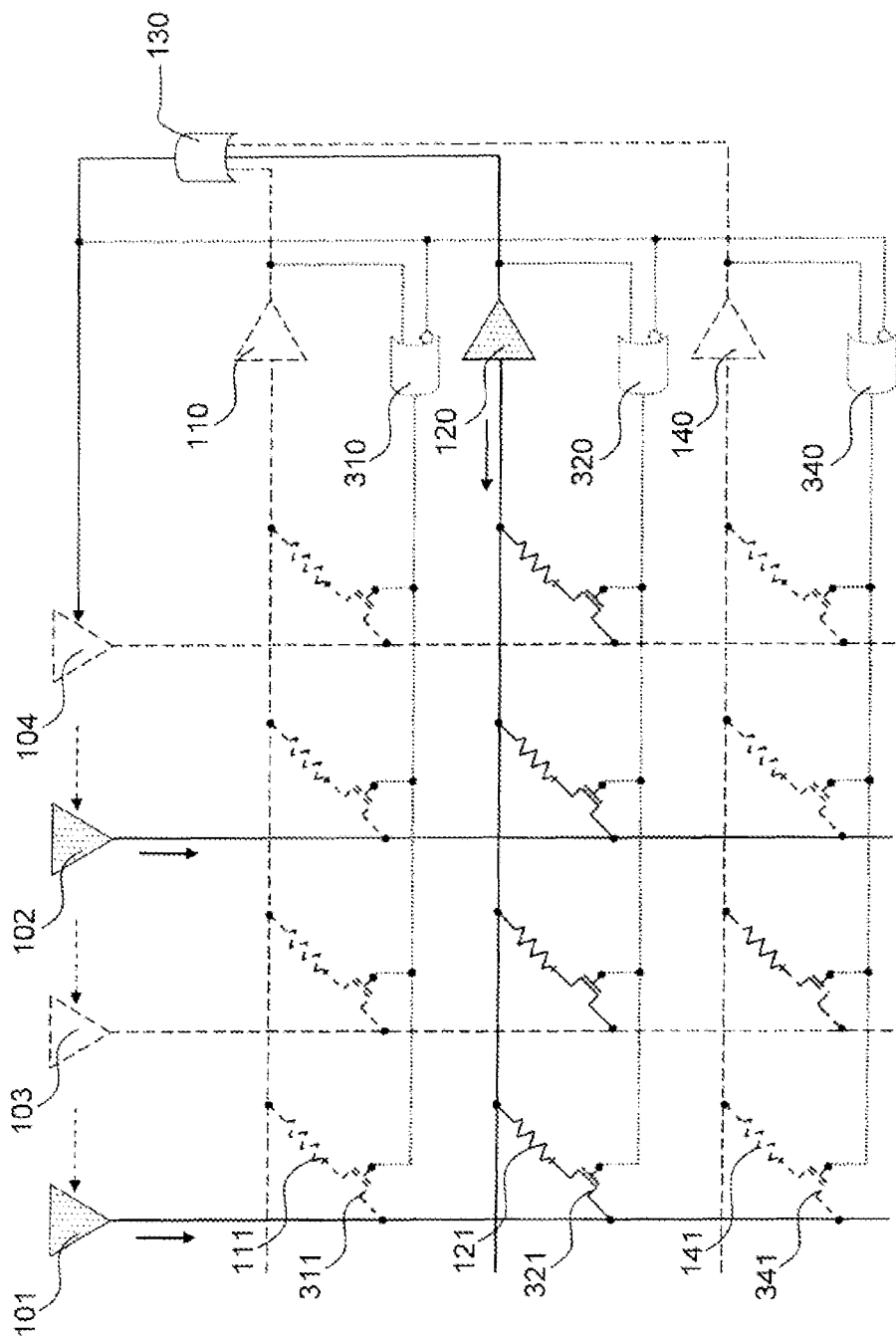

FIG. 3 represents a functional schematic of an artificial neural network according to a second embodiment of the invention. The elements identical to those already described in FIG. 1 bear the same references. All the output neurons 110,120 are furthermore linked to the set of input neurons 101,102,103,104 for example by way of an OR logic gate 130 which produces as output an active signal if at least one of its inputs is active. The role of this feedback control will be detailed further on in the description. Any means equivalent to the OR logic gate 130 and carrying out the same function with a view to the same result can be substituted for it without departing from the scope of the invention.

In a variant embodiment of the invention, it may be useful or necessary, when an output neuron 120 is active, to deactivate the artificial synapses 111,141 connected to the other output neurons 110,140, that is to say to disconnect them from the neural network by disconnecting one of its terminals or by imposing an infinite impedance on one of its terminals. The utility of this deactivation will be explained further on in the description. To carry out this functionality, each synapse 111, 121,141 is, for example, coupled in series with a field-effect transistor 311,321,341 whose drain is connected to the input terminal of the synapse, whose source is connected to the communicating junction which links the synapse to an input neuron 101 and whose gate is connected to the output of an OR logic gate 320. The gates of the transistors linked to all the synapses connected to one and the same output neuron 120 are connected to the same OR logic gate 320. Said OR logic gate 320 receives on a first input a signal originating from the output neuron 120 with which it is paired, said signal containing the information of the active or inactive state of said neuron 120. On its second, complemented, input the OR logic gate 320 receives the output signal from the OR logic gate 130. Thus, the output signal of the OR logic gate 320 is active when the output neuron 120 with which it is paired is itself active and inactive if this output neuron 120 is inactive and if one of the other output neurons 110,140 is active. The set consisting of a transistor 321 and of the OR logic gate 320 represents a selection device whose function is, when an output neuron 120 is active, to deactivate the set of synapses connected to the other output neurons 110,140. Without departing from the scope of the invention any other selection device carrying out the same function with a view to the same result is conceivable.

An artificial neuron is an active component, the modeling of which is inspired by the operation of a biological neuron. Within the framework of the invention, an artificial neuron is a component capable of generating an electrical pulse or "spike" corresponding to an electrical transition of short duration between two distinct states. When a neuron emits a pulse toward a synapse to which it is connected downstream one speaks of a pre-synaptic pulse. When a neuron emits a pulse toward a synapse to which it is connected upstream one speaks of a post-synaptic pulse. A pre-synaptic pulse propagates toward the synapses to which the input neuron is connected, its amplitude may possibly be modified as a function of the conductance or weight of the synapse and is then propagated up to the output neurons. An output neuron carries out an integration of the input currents or voltages over time. When this integration exceeds a predetermined threshold, the output neuron is activated and then generates a post-synaptic pulse which is retropropagated to the synapses to which it is connected. Furthermore, a leakage current is usually present in the neuron, this involving a progressive decrease in the integration in the neuron when no signal is applied to its input. A possible but nonlimiting modeling of the operation of a neuron is given by the following differential equation:

$$u + \tau_{leak} \frac{du}{dt} = 0,$$

where u is the integration variable of the neuron (voltage or current) and $\tau_{leak}$ is a parameter dimensionally equivalent to the duration after which the integration u becomes zero when no signal is produced at the input of the neuron. The state of the integration variable is updated on receipt of each new pre-synaptic pulse, at an instant $t_{spike}$, by adding the weight w of the pulse, this being manifested by a modeling of the integration variable u in the following form:

$$u = u \cdot \exp\left(-\frac{t_{spike} - t_{last\text{-}spike}}{\tau_{leak}}\right) + w,$$

where $t_{last\text{-}spike}$ and $t_{spike}$ are the instants of reception by the neuron of two successive pre-synaptic pulses.

When the integration variable u exceeds a predetermined threshold, a new post-synaptic pulse is created and transmitted to all the connected synapses. In the case where an output neuron is also an input neuron for other synapses, it also generates a pre-synaptic pulse when its threshold is exceeded. When the pulse or pulses are dispatched, the integration variable u is reset to 0 or to a predetermined initial value.

Other modeling parameters can be taken into account such as the refractory period $T_{refractory}$ during which the integration variable remains at 0 or the lateral inhibition period $T_{inhibition}$ during which all the other neurons are deactivated, that is to say their internal integration mechanism is stopped, when a neuron transmits a pulse. To allow an output neuron to carry out a lateral inhibition, means of communication between output neurons, which are not represented in the diagram of FIG. 1, should be introduced into the neural network according to the invention.

As introduced previously, an artificial synapse can be embodied by a memristive device whose conductance varies as a function of the current which passes through it or of the voltage across its terminals. Two types may be distinguished; bipolar or unipolar memristive devices.

Bipolar devices are those whose conductance can be increased by voltage pulses according to one polarity and decreased by pulses according to the opposite polarity. Moreover the pulses of low magnitude in the two polarities do not appreciably modify the conductance. The memristive devices of CBRAM, "Conductive-Bridging RAM", type and certain components of the OXRAM, "Oxide RAM", family are bipolar devices.

Figure 4A:
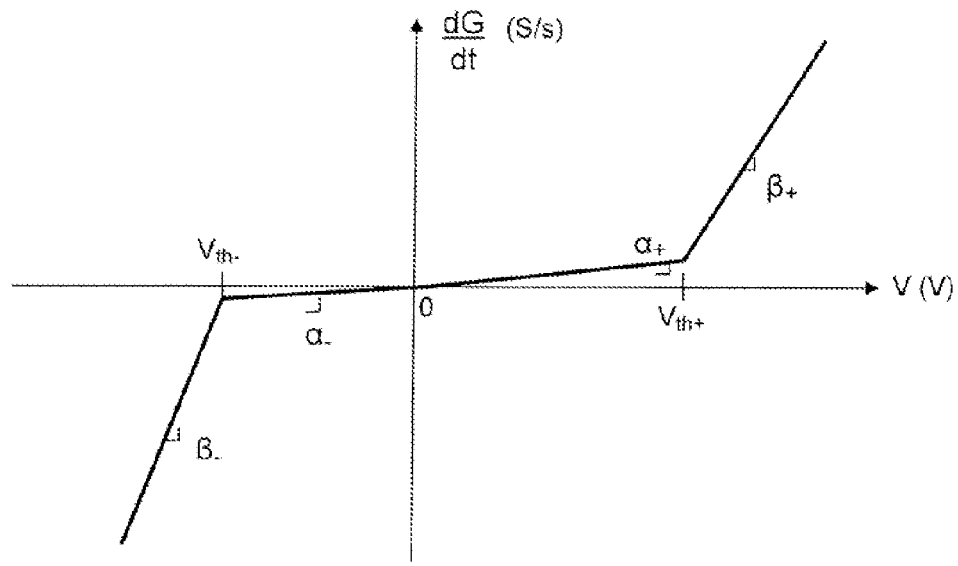
Figure 4B:
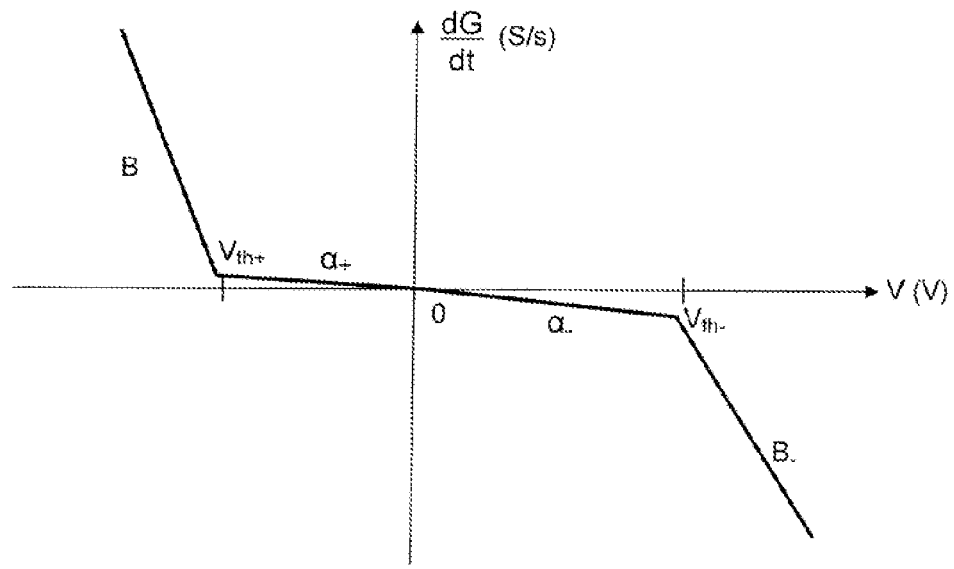

FIGS. 4a and 4b represent, on a chart of the variation in conductance dG/dt over time as a function of the voltage V across the terminals of the device, the $1^{st}$-order characteristics of bipolar memristive devices.

In FIG. 4a, for positive voltages, the conductance G hardly increases, if at all, (with a slope $\alpha+$) for voltages lying between 0 and $V_{th+}$ volts and then increases appreciably, with a slope $\beta+$ much greater than $\alpha+$, for voltages above $V_{th+}$. The voltage $V_{th+}$ corresponds to the voltage threshold beyond which the conductance increases appreciably. Likewise for negative voltages, the conductance G hardly decreases, if at all, (with a slope $\alpha-$) for voltages lying between $V_{th-}$ and 0 volts and decreases appreciably, with a slope $\beta-$ much greater than $\alpha-$ in absolute value, for voltages below $V_{th-}$. The voltage $V_{th-}$ corresponds to the voltage threshold below which the conductance decreases appreciably.

FIG. 4b represents the $1^{st}$-order characteristic of a bipolar memristive device for which the voltage $V_{th-}$ is positive and the voltage $V_{th+}$ is negative.

Figure 5A:
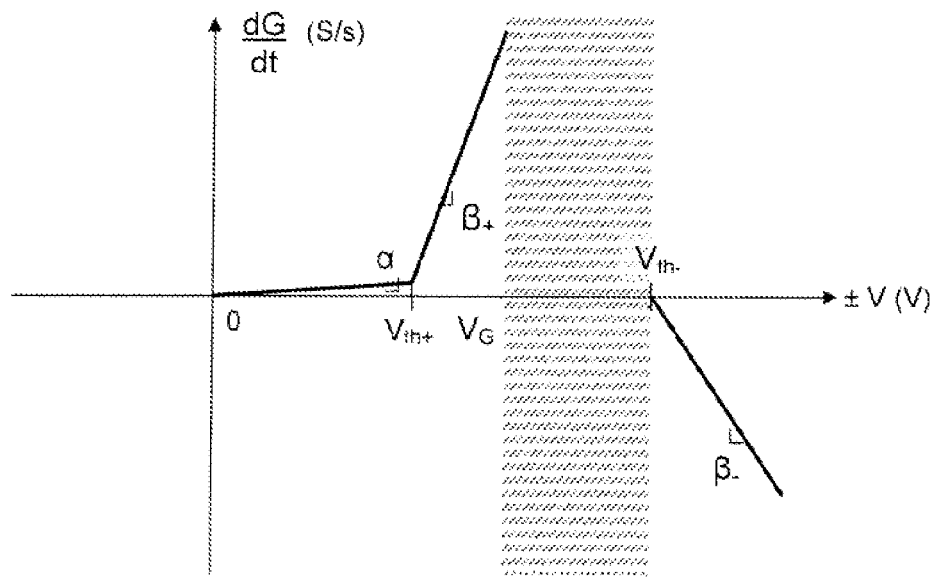
Figure 5B:
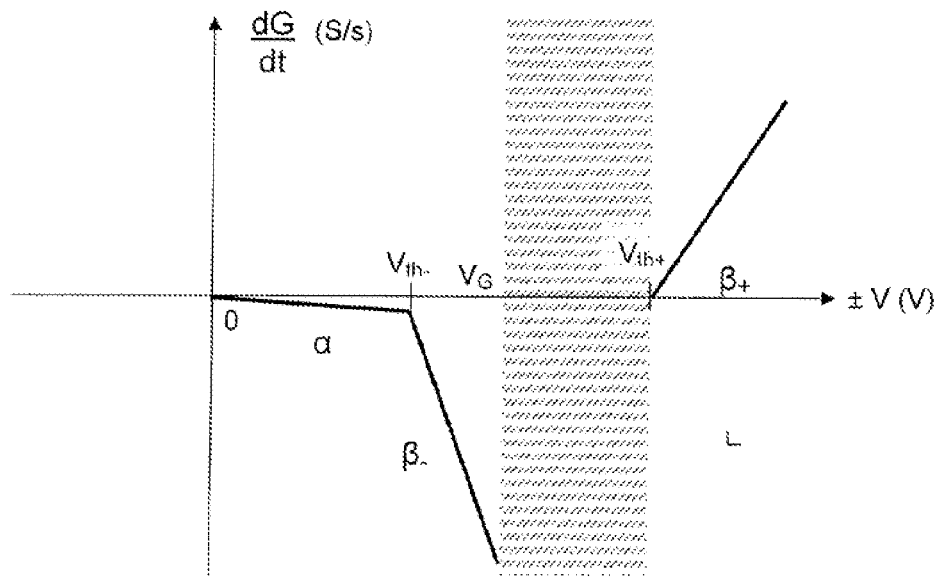

FIGS. 5a and 5b represent the $1^{st}$-order characteristics of unipolar memristive devices.

For such devices, a voltage pulse in a first magnitude span makes it possible to increase the conductance of the device whereas a voltage pulse of like polarity but in a second magnitude span makes it possible to decrease the conductance of the device. Furthermore, voltages of low magnitude do not appreciably modify the conductance.

In FIG. 5a, the conductance of the device hardly increases, if at all, (with a slope $\alpha$) for voltages lying between 0 and $V_{th+}$ volts and then increases appreciably with a slope $\beta+$ much greater than $\alpha$ for voltages greater than $V_{th+}$ and less than a voltage $V_G$. The conductance is appreciably decreased, with a slope $\beta-$ much greater than $\alpha$ in absolute value, when the voltage exceeds a second voltage threshold $V_{th-}$.

FIG. 5b illustrates the case where the voltage $V_{th-}$ is less than the voltage $V_{th+}$ and the conductance begins by decreasing and thereafter increases the higher the voltage across the terminals of the device.

The nano-devices of PCM "Phase Change Memory" or PCRAM "Phase-Change RAM" type are unipolar memristive devices.

The bipolar and unipolar devices whose characteristics have been described in FIGS. 4a, 4b, 5a and 5b are used to implement an artificial synapse in a neural network according to the invention.

The pre and post synaptic pulses dispatched by the input and output neurons toward a synapse will therefore act on the variation of its conductance. In a conventional manner, one speaks of LTD ("Long Term Depression") phases or states to designate an event corresponding to a decrease in the conductance of a synapse subsequent to the transmission of one or more pulses. Likewise the term LTP for "Long Term Potentiation" designates the phases or states corresponding to an increase in the conductance of a synapse.

Figure 6A:
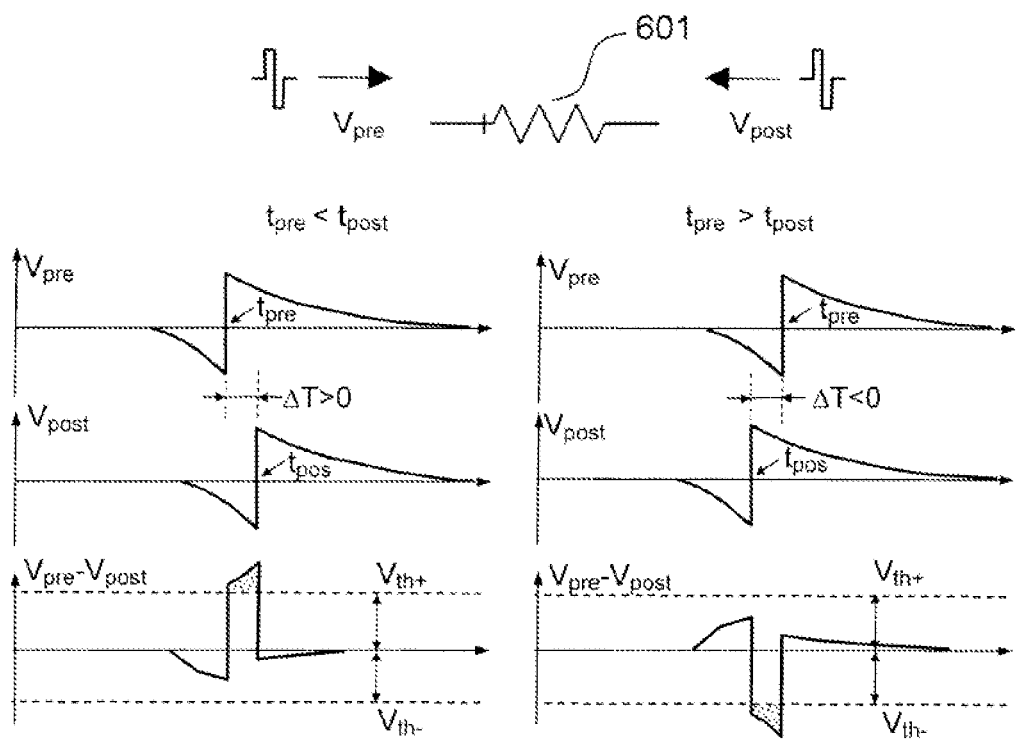

FIG. 6a illustrates, on several voltage-time charts, the LTD and LTP states within the framework of a conventional learning rule of STDP type. The principle of the STDP "Spike Timing Dependent Plasticity" learning rule consists in making the weight of a synapse evolve as a function of the temporal distance between the pre and post-synaptic pulses. The synapse 601 considered exhibits a characteristic of the type of that of FIG. 4a.

When a pre-synaptic pulse of amplitude $+/-V_{pre}$ is received by a synapse 601 at an instant $t_{pre}$ and a post-synaptic pulse of amplitude $+/-V_{post}$ is received by this same synapse 601 at a subsequent instant $t_{post}$, then the voltage across the terminals of the synapse, which is equal to $V_{pre}-V_{post}$, becomes greater in absolute value than the threshold $V_{th+}$ of the synapse 601 for which the conductance will increase. Conversely if the post-synaptic pulse is received by the synapse at an instant prior to the pre-synaptic pulse, in this case the voltage across the terminals of the synapse becomes greater in absolute value than the threshold $V_{th-}$ for which the conductance will decrease.

The LTD state corresponds to the state of depression of the synapse, that is to say a state during which the conductance of the synapse decreases. The LTD phase has a given duration which corresponds to the duration for which the conductance of the synapse decreases. Likewise the LTP state corresponds to the state of potentiation of the synapse and the LTP phase has a given duration corresponding to the duration for which the conductance of the synapse increases. In the case of a conventional STDP learning rule, the variation in the conductance of the synapse depends on the relative instants of arrival of the two pulses, pre and post synaptic.

Figure 6B:
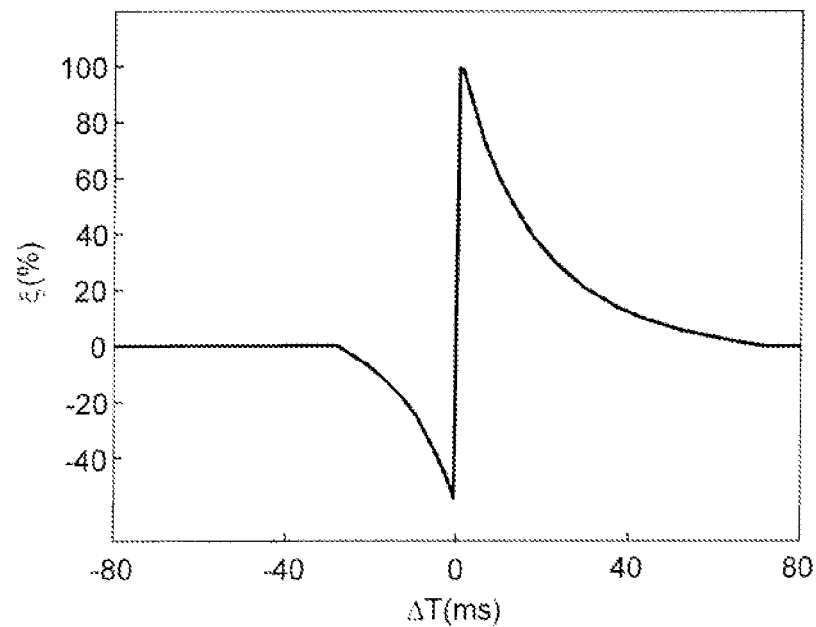

FIG. 6b illustrates, on a chart, the variation $\xi$, expressed as a percentage, of the conductance of a synapse as a function of the temporal gap $\Delta T=t_{post}-t_{pre}$, expressed in ms, between the respective instants of arrival of the pre-synaptic and post-synaptic pulses at the input of the synapse. The curve of FIG. 6b is typical of the STDP biological learning rule. The objective of the present invention is notably the implementation of a learning rule which differs from this conventional STDP rule.

Figure 7:
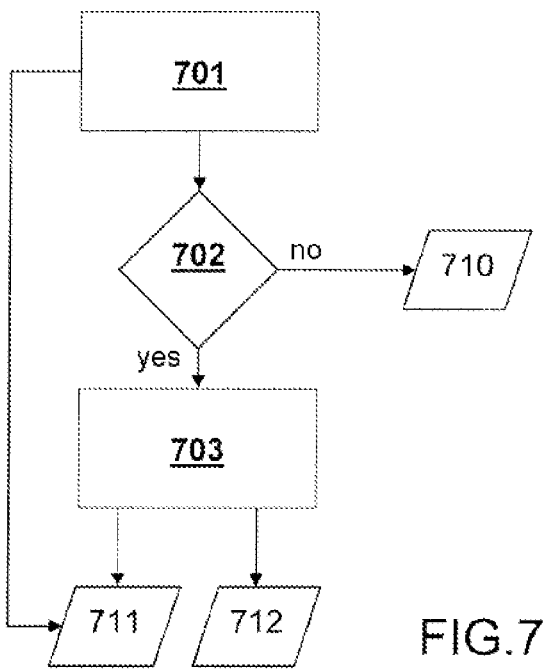

FIG. 7 shows diagrammatically on a flowchart the essential steps of the unsupervised learning method according to a first embodiment of the invention implemented by the artificial neural network described in FIG. 1.

In a first step 701, an active input neuron 101,102 emits a pre-synaptic pulse toward the synapses 111,121,112,122 to which it is connected downstream. This pulse has a duration equal to the duration of the LTP phase associated with the neuron which has emitted it. The neuron is said to be in an LTP state, this signifying that the pulses that it generates can potentially bring about an increase in the conductance of the synapses which receive them, with the proviso that these synapses subsequently receive, but during the LTP duration, a post-synaptic pulse originating from an output neuron to which they might be connected.

The pre-synaptic pulse passes through the synapses 111, 121,112,122 and is then propagated up to the output neuron 110,120 to which they are connected downstream. The output neuron 110,120 integrates 702 this pulse, weighted by the conductance of the synapse, in such a way as to increase its integration variable u as described previously. Two typical cases then arise.

If the integration variable u of the output neuron 120 does not exceed its activation threshold, then the output neuron is not activated; nothing happens. The conductance of the synapses has not been modified since the amplitude of the pre-synaptic pulse is configured so as not to exceed one of the depression or potentiation thresholds $V_{th-}$, $V_{th+}$ of a synapse. This phase 710 of the method is also called the reading phase since it does not bring about any modification of the weights of the synapses but is aimed at obtaining the activation of an output neuron so as to trigger the learning as well as to extract the information arising from this learning.

When the integration variable u of the output neuron 110 exceeds its activation threshold, the output neuron 110 is activated and generates 703 a post-synaptic pulse toward the synapses 111,112,113,114 to which it is connected upstream. The synapses 111,112 which have been previously excited by pre-synaptic pulses and which are therefore in the LTP phase will then increase 711 their conductance when there is temporal overlap between the pre and post synaptic pulses.

The other synapses 113,114 which receive the post-synaptic pulse without having previously received a pre-synaptic pulse and which are therefore not in an LTP phase are automatically depreciated 712, that is to say their conductance is decreased; they enter the LTD phase. This operation is possible since the post-synaptic pulse is configured so that its level exceeds in absolute value the depression threshold $V_{th-}$ of the synapse.

Figure 8:
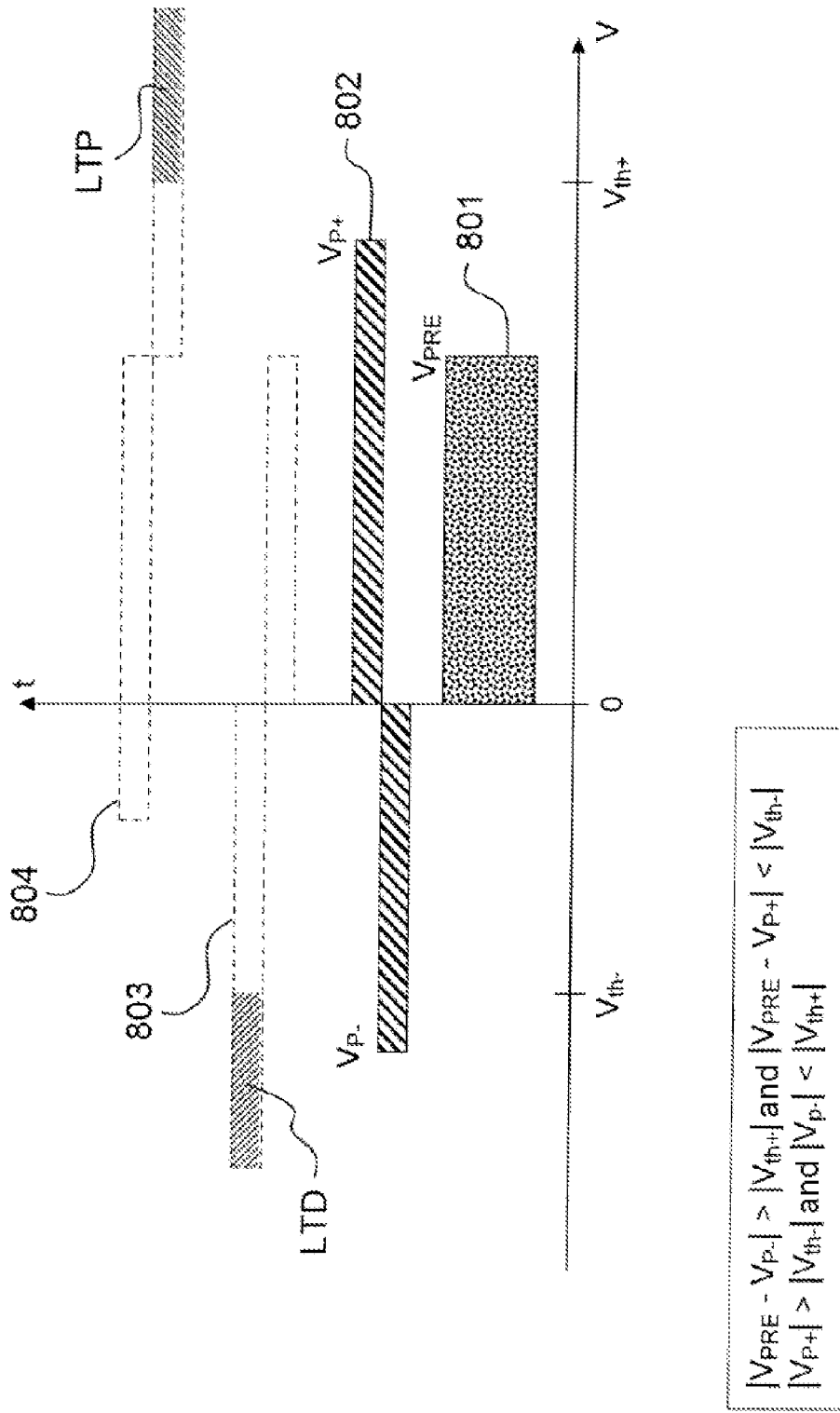
Figure 9A:
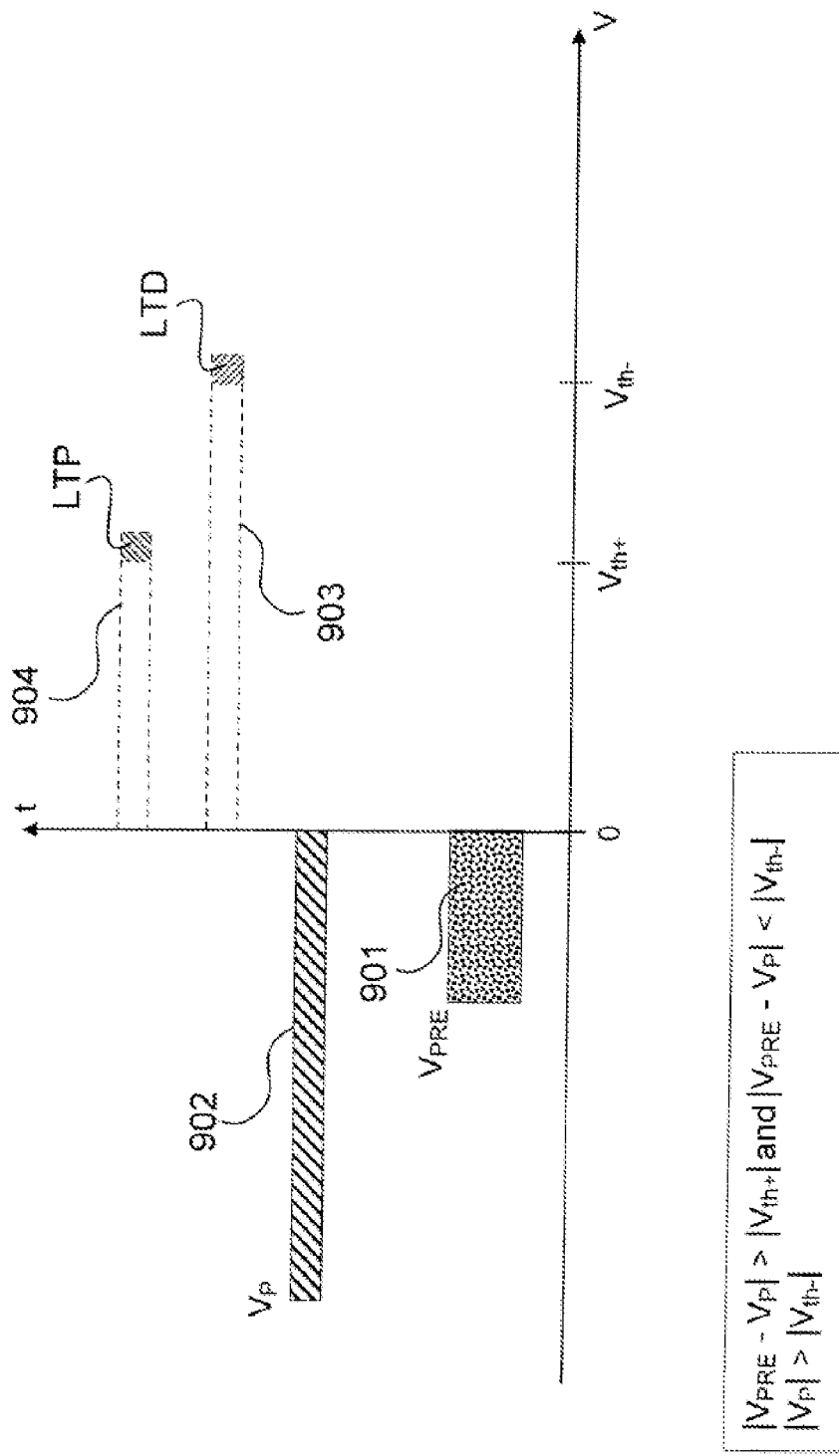
Figure 9B:
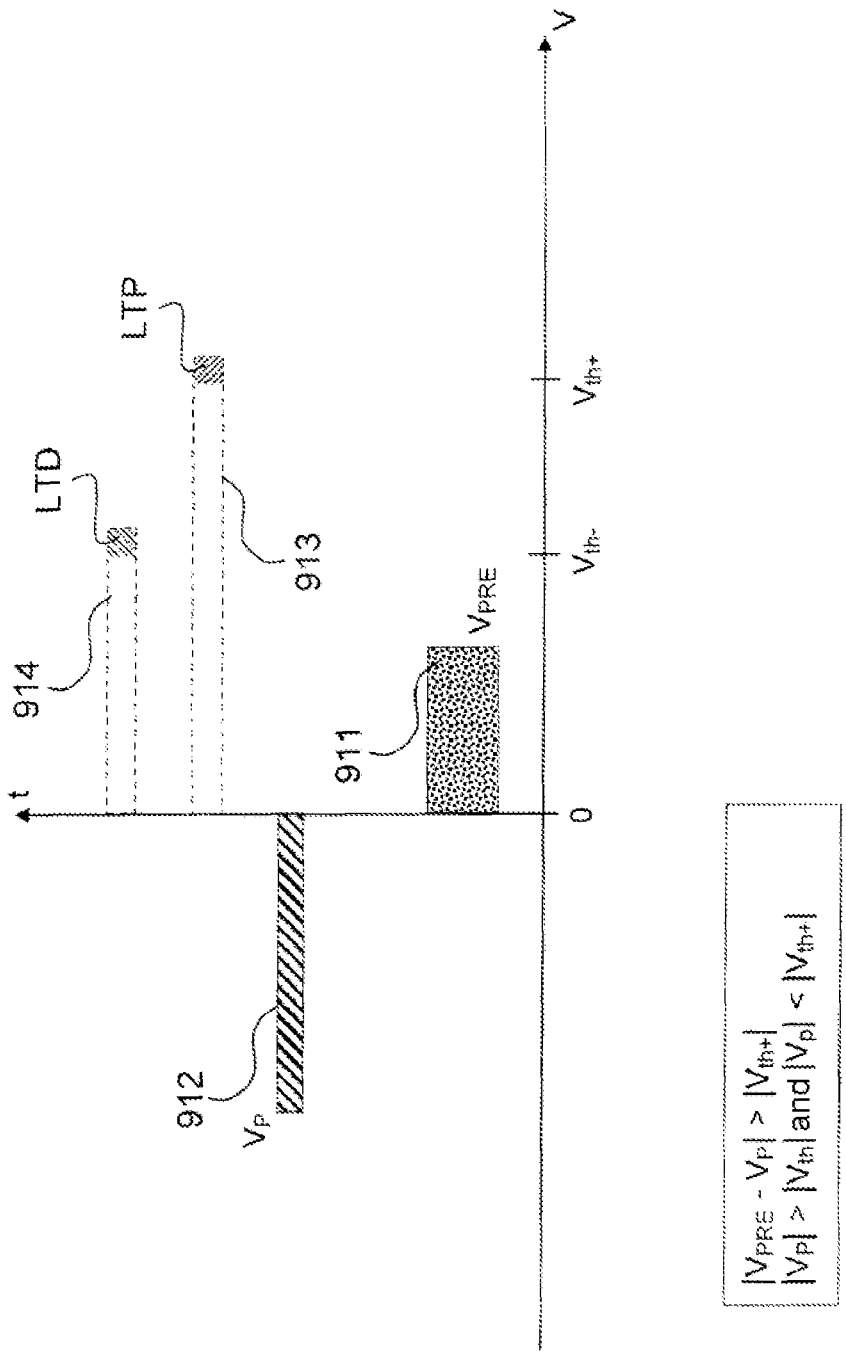

FIGS. 8, 9a and 9b now describe the shape and the constraints to be complied with in respect of the pre and post synaptic pulses so as to be able to implement the method according to the invention described in FIG. 7.

FIG. 8 relates to the case of the artificial synapses embodied on the basis of bipolar memristive devices whose characteristics can be modeled to $1^{st}$-order by the curves of FIGS. 4a and 4b.

The pre-synaptic pulse 801 has a predetermined duration equal to the duration of the LTP phase and a predetermined amplitude $V_{PRE}$.

The post-synaptic pulse 802 consists of a pulse of predetermined positive amplitude $V_{P+}$ followed by a pulse of predetermined negative amplitude $V_{P-}$.

To implement the learning method according to the invention, the pulses 801,802 must be configured so that a post-synaptic pulse 802 alone brings about an LTD depreciation of the synapse whereas a post-synaptic pulse 802 simultaneous with a pre-synaptic pulse 801 brings about an LTP potentiation of the synapse.

In the first case, the voltage 803 recorded across the terminals of the synapse is equal to the opposite of the voltage of the post-synaptic pulse.

In the second case 804, it is equal to the difference between the voltage of the pre-synaptic pulse and that of the post-synaptic pulse.

The constraints to be complied with on the levels of the two pulses are given by the following relations:

$$|V_{PRE}-V_{P-}|>|V_{th+}| \text{ and } |V_{PRE}-V_{P+}|<|V_{th-}|$$

$$|V_{P+}|>|V_{th-}| \text{ and } |V_{P-}|<|V_{th+}|$$

In the case where the characteristic of the bipolar device is that of FIG. 4b, that is to say in the case where $V_{th+}<V_{th-}$, then the polarities of the voltages $V_{PRE}$, $V_{P+}$ and $V_{P-}$ are reversed.

FIG. 9a relates to the case of the artificial synapses embodied on the basis of unipolar memristive devices whose characteristics can be modeled to $1^{st}$-order by the curve of FIG. 5a.

The pre-synaptic pulse 901 has a predetermined duration equal to the duration of the LTP phase and a predetermined amplitude $V_{PRE}$ of negative bias.

The post-synaptic pulse 902 consists of a single pulse of predetermined negative amplitude $V_P$.

When the synapse is traversed by a post-synaptic pulse alone, the voltage 903 across its terminals is equal to the opposite of the voltage of the post-synaptic pulse. In order for a depression (LTD state) to be engaged, it is therefore necessary that $|V_P|>|V_{th-}|$.

When a pre-synaptic pulse and a post-synaptic pulse exhibit a temporal overlap, then the voltage 904 across the terminals of the synapse is equal to the difference between the voltage of the pre-synaptic pulse and that of the post-synaptic pulse. In order for a potentiation (LTP state) to be engaged, it is then necessary that $|V_{PRE}-V_P|>|V_{th+}|$ and $|V_{PRE}-V_P|<|V_{th-}|$ so as to attain a voltage situated in the zone of potentiation of the characteristic of FIG. 5a. This condition is notably complied with when $V_{PRE}=V_{th+}-V_{th-}$.

FIG. 9b relates to the case of the artificial synapses embodied on the basis of unipolar memristive devices whose characteristics can be modeled to $1^{st}$-order by the curve of FIG. 5b.

The pre-synaptic pulse 911 has a predetermined duration equal to the duration of the LTP phase and a predetermined amplitude $V_{PRE}$ of positive bias.

The post-synaptic pulse 912 consists of a single pulse of predetermined negative amplitude $V_P$.

When the synapse is traversed by a post-synaptic pulse alone, the voltage 913 across its terminals is equal to the opposite of the voltage of the post-synaptic pulse. In order for a depression (LTD state) to be engaged, it is therefore necessary that $|V_P|>|V_{th-}|$ and $|V_P|<|V_{th+}|$. When a pre-synaptic pulse and a post-synaptic pulse exhibit a temporal overlap, then the voltage 914 across the terminals of the synapse is equal to the difference between the voltage of the pre-synaptic pulse and that of the post-synaptic pulse. In order for a potentiation (LTP state) to be engaged, it is then necessary that $|V_{PRE}-V_P|>|V_{th+}|$ so as to attain a voltage situated in the zone of potentiation of the characteristic of FIG. 5b. This condition is notably complied with when $V_{PRE}=V_{th+}-V_{th-}$.

Figure 10:
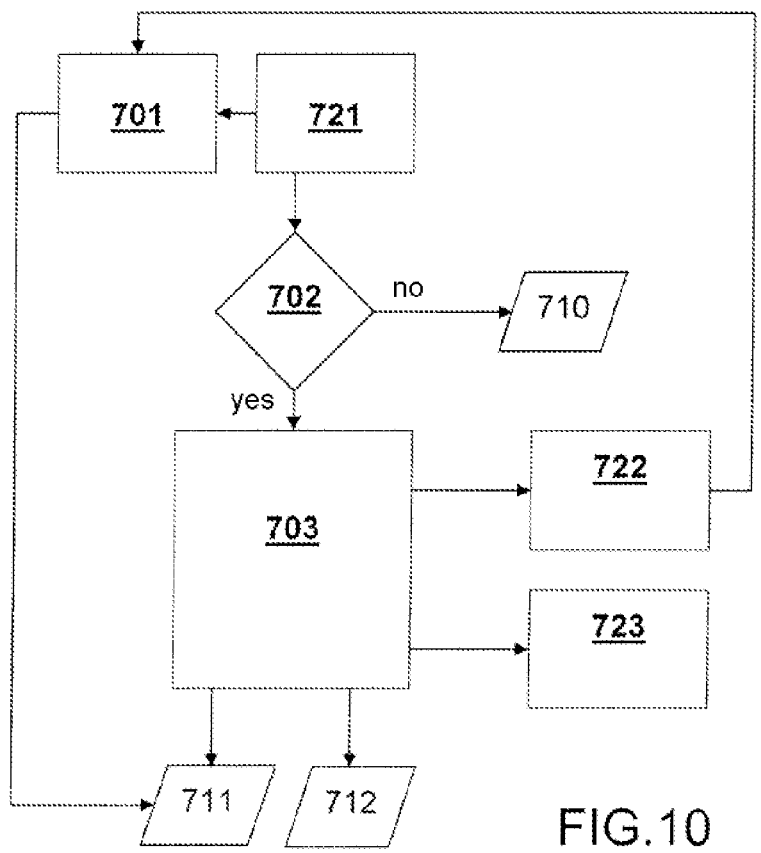

FIG. 10 shows diagrammatically on a flowchart the essential steps of the learning method according to a second embodiment of the invention, implemented by the artificial neural network described in FIG. 3. The common elements shared between FIG. 7 and FIG. 10 bear the same references.

This second embodiment of the invention relates to the case where a unipolar memristive device is used to embody the artificial synapses and whose $1^{st}$-order characteristic satisfies the following inequality: $|V_{th+}-V_{th-}|>\min(|V_{th+}|,|V_{th-}|)$, where min denotes the minimum function. In a typical case such as this, the pre-synaptic pulse whose level is, in absolute value, substantially equal to $V_{th+}-V_{th-}$ will exceed one of the two activation thresholds $V_{th+},V_{th-}$ of the synapse and will therefore bring about, on its own, an increase or a decrease in the conductance of the synapse. This effect is not sought; on the contrary, according to the invention, a pre-synaptic pulse alone must not modify the conductance of a synapse but must serve only to contribute to the activation of the output neurons.

To alleviate this problem, the learning method according to the invention is modified as described in FIG. 10.

In a first step 721, the input neuron 101,102 generates a first activation pulse whose level is below the activation thresholds $V_{th+},V_{th-}$ of the synapse but sufficient to contribute to increasing the integration variable of the output neurons 120. It passes simultaneously to an LTP state, thus signifying that it is active and can transmit a pre-synaptic pulse.

If the integration variable u of the output neuron 120 does not exceed its activation threshold, then the output neuron is not activated, nothing happens and the weights of the synapses are not modified.

When the integration variable u exceeds the activation threshold of the output neuron 120, the latter generates 703 a post-synaptic pulse and then carries out two additional functions.

The first function 722 consists in informing all the input neurons 101,102,103,104 of the network that an output neuron 120 is activated. This information is produced by means of the OR logic gate 130 linking the output neurons and the input neurons in the manner described in FIG. 3. The input neurons 101 which are active and in an LTP state then generate 701 a pre-synaptic pulse toward the synapses 111,121, 141 to which they are connected. The synapses 121 which have simultaneously received a post synaptic pulse will therefore be potentiated; their conductance will increase.

The second function 723 consists in deactivating the synapses 111,141 connected to the other output neurons 110,140. In this manner, these synapses 111,141 will not be affected by the pre-synaptic pulse alone.

The deactivation 723 is carried out by means of the selection devices constituting part of the neural network described in FIG. 3.

In another variant embodiment of the invention, not shown diagrammatically, the selection devices can be dispensed with and replaced with a diode mounted in series with each synapse and configured so as to comply with the inequality $|V_{th+}-V_{th-}|<\min(|V_{th+}|,|V_{th-}|)$. If $V_D$ is the threshold voltage of the diode, the activation thresholds $V_{th+},V_{th-}$ of the synapse are increased by this voltage $V_D$ and the inequality to be complied with becomes $|V_{th+}-V_{th-}|<\min(|V_{th+}|,|V_{th-}|)+V_D$, this being less constraining. The diode is mounted so as to be biased in the forward direction for all the effective voltages passing through the synapse.

The variant embodiment of the learning method according to the invention described in support of FIG. 10 necessarily applies in respect of synapses embodied on the basis of unipolar memristive devices which satisfy the inequality $|V_{th+}-V_{th-}|>\min(|V_{th+}|,|V_{th-}|)$, but may also apply in respect of the other types of memristive devices described. Likewise, the deactivation step (723) alone may be rendered optional for devices which do not satisfy the aforementioned inequality.

The unsupervised learning method according to the invention can be advantageously used to carry out a detection of temporally correlated sequences in a data stream produced as input to a neural network according to the invention.

An exemplary application of the method and of the network according to the invention for learning and detection of trajectory of a mobile object on the basis of video data is now described. This example is introduced so as to illustrate a concrete use of the invention; it is however wholly non-limiting, the invention applying in a similar manner to multiple other applications such as will be described further on.

The following example is based on the utilization of real or simulated data filmed by an asynchronous CMOS retina. This type of component uses the principle of AER "Address-Event Representation" data representation to emit in an asynchronous manner pulses associated with each pixel of the retina in response to temporal and/or spatial local changes of contrast. Thus, a pixel generates an event whenever the relative variation of the intensity of the illumination of the pixel exceeds a positive or negative threshold. As a function of the sign of the intensity variation, two types of events, ON and OFF, can be generated in association with an increase or decrease in the illumination of a pixel. The AER data therefore correspond to pulses, associated with the ON and OFF events, which can be produced as input to a neural network to activate the input neurons. The CMOS retina can also itself be considered to consist of a set of input neurons, associated with each pixel, and producing activation pulses toward the input neurons 101,102,103,104 of the network according to the invention.

Figure 11:
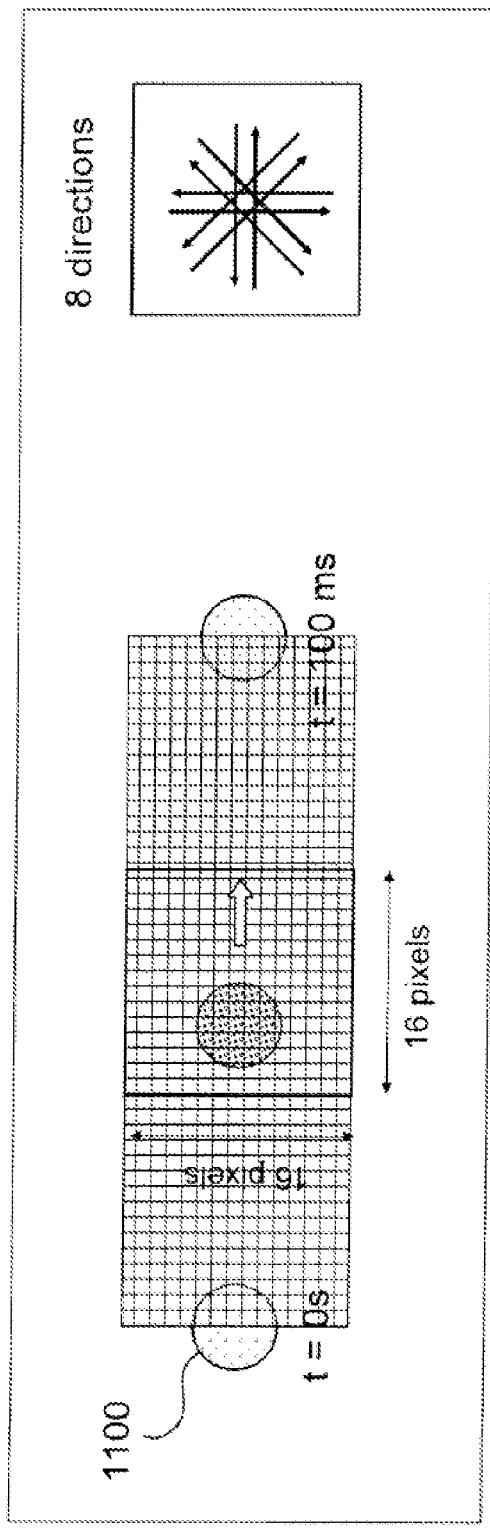

FIG. 11 illustrates the learning of the trajectories followed by a mobile object 1100 moving according to the eight directions shown diagrammatically by the arrows of the left part of FIG. 11. The resolution of the image captured is 16×16 pixels in the example. Each pixel can produce two types of different pulses, associated with the ON and OFF events. The neural network then requires 2*16*16=512 synapses for each output neuron. 48 output neurons are available. The principle of lateral inhibition is also implemented, that is to say each output neuron deactivates the integration of the other output neurons for a duration $T_{inhibit}$ predetermined from the instant at which it is itself activated.

When an output neuron is activated, it transmits a post-synaptic pulse toward the synapses to which it is connected. The synapses which have been recently activated by pre-synaptic pulses are potentiated, the others are depreciated. This mechanism makes it possible to increase the sensitivity of an output neuron to a temporal sequence of data which has made it possible to activate it, and thus to render more probable its future activation for a temporally correlated similar sequence. On account of the presence of leakage currents in a neuron, just the contribution of sequences of pulses activating a majority of synapses which are strongly potentiated for a short duration may bring about the exceeding of the integration threshold of the neuron with a high probability.

Figure 12:
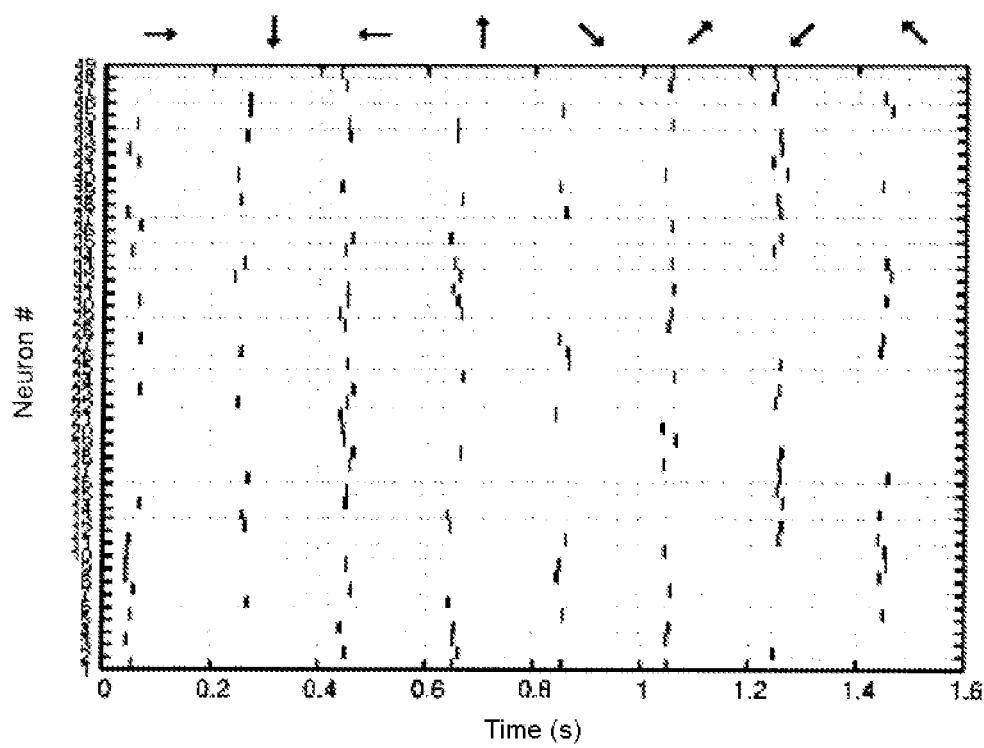
Figure 13:
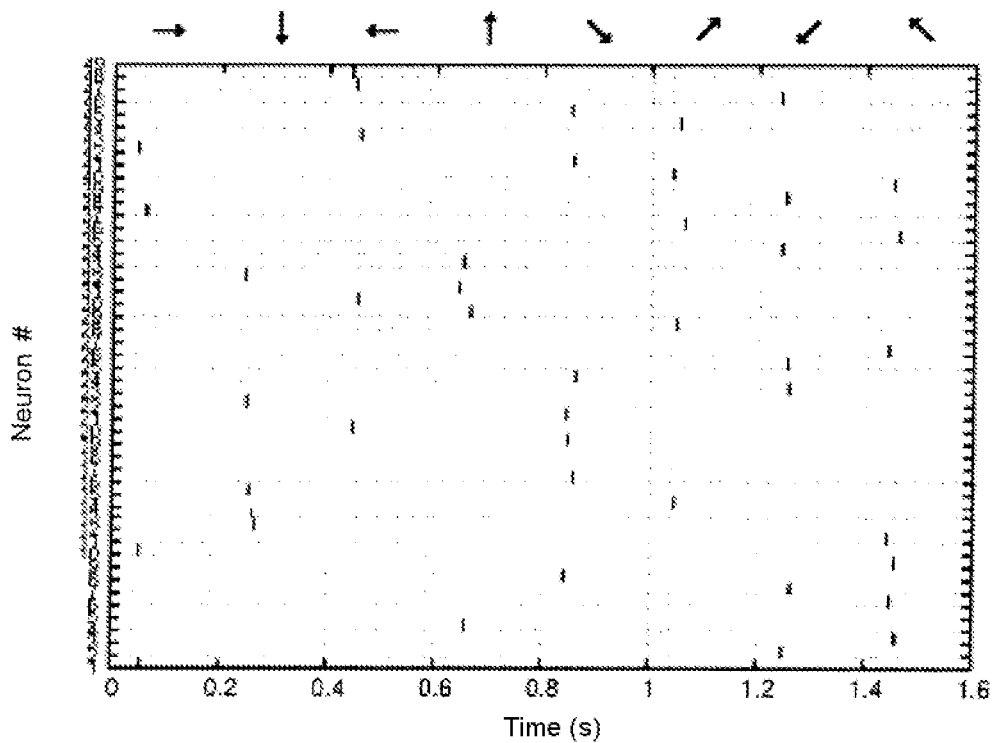

FIGS. 12 and 13 represent, on two charts, the instants of activation of the output neurons as a function of the trajectory followed by the object, before and after convergence of the learning method according to the invention. Each trajectory is represented by an arrow pointing in the direction of the motion and has a duration of 100 ms. The ordinate axis corresponds to the 48 output neurons of the network.

Initially, the synapses of the network have conductances equal on average to 80% of their maximum value, thus all the output neurons are reactive and little selectivity is observed according to the various trajectories as is illustrated in FIG. 12.

FIG. 13 represents the same results once the learning has converged to a stable state. Each neuron is then specialized in the learning of a trajectory, out of the 8 that are indicated. By simply monitoring the activation of a particular neuron out of the 48 available, it is thus possible to detect the type of trajectory followed by the mobile object.

More complex data sequences can also be processed by the network and the method according to the invention. A CMOS retina filming cars traveling on a highway with several lanes can produce pulse-like sequences of data which, provided as input to a neural network according to the invention, allow the learning of the trajectories of the cars and the detection of the number of cars traveling in each lane.

Furthermore a neural network according to the invention, such as described in FIGS. 1 and 3, can be utilized within a so-called multi-layer network which comprises several neuronal structures in series. The output neurons of one layer constitute the input neurons of the next layer. Such an architecture makes it possible to further improve the precision of the extraction and of the detection of temporally correlated sequences.

Without departing from the scope of the invention, other applications of the invention are possible, among which:
  the extraction and the classification of temporally correlated sequences, such as sounds, syllables or words, within audio data,
  the recognition of shapes within image or video data,
  the extraction and the classification of molecules or chemical agents within biological data produced by chemical sensors.

The invention claimed is:

1. A method of unsupervised learning in an artificial neural network comprising a plurality of artificial neurons mutually interconnected by means of artificial synapses, said method comprising at least the following steps:
  generating, in at least one first neuron, called an input neuron, a pre-synaptic pulse and propagating it to the synapses to which it is directly connected downstream,
  propagating the pre-synaptic pulse, weighted by the conductance of said synapses, to the neurons to which they are directly connected downstream, called output neurons,
  integrating, in the output neurons, said pulses and comparing the result with a predetermined activation threshold,
  when said activation threshold is exceeded, activating the output neuron, generating, in this neuron, a post-synaptic pulse and retro-propagating it to the synapses to which it is directly connected upstream,
  when there is temporal overlap, at the level of a synapse, between a pre-synaptic pulse and a post-synaptic pulse, increasing the conductance of said synapse, and
  when a synapse receives a post-synaptic pulse and there is no temporal overlap with a pre-synaptic pulse, decreasing its conductance.

2. The learning method of claim 1, further comprising:
  generating, in at least one first input neuron, an activation pulse, propagating it to the synapses to which it is directly connected downstream and activating said input neuron for a predetermined duration, the amplitude of the activation pulse being configured so as not to cause appreciable variation in the conductance of said synapses,
  when the activation threshold of an output neuron is exceeded, informing all the input neurons of the activation of said output neuron and generating consecutively, in the active input neurons, a pre-synaptic pulse.

3. The learning method of claim 2, further comprising the following step: when the integration threshold of an output neuron is exceeded, deactivating the synapses directly connected to the other output neurons by disconnecting one of the terminals of said synapses or by imposing an infinite impedance on it.

4. Neural network comprising a plurality of artificial neurons, each input neuron being connected to each output neuron by way of an artificial synapse, wherein said network comprise means configured for implementing the unsupervised learning method as claimed in claim 1.

5. The neural network of claim 4, wherein an artificial synapse is embodied by a bipolar memristive device whose conductance increases when the voltage across its terminals is biased in one direction, decreases when the voltage across its terminals is biased in the opposite direction and remains substantially constant when the voltage across its terminals exhibits an amplitude lying between a first threshold $V_{th-}$ of negative polarity and a second threshold $V_{th+}$ of positive polarity.

6. The neural network of claim 5, wherein a pre-synaptic pulse has an amplitude $V_{PRE}$ of constant polarity, a post-synaptic pulse consists of a first pulse of predetermined amplitude $V_{P+}$ followed by a pulse of amplitude $V_{P-}$ of opposite polarity to that of the first pulse, said pulses being configured so as to comply with the following two inequalities:

$|V_{PRE}-V_{P-}|>|V_{th+}|$ and $|V_{PRE}-V_{P+}|<|V_{th-}|$ $|V_{P+}|>|V_{th-}|$ and $|V_{P-}|<|V_{th+}|$.

7. The neural network of claim 4, wherein an artificial synapse is embodied by a unipolar memristive device whose conductance increases when the voltage across its terminals is above a first predetermined threshold $V_{th+}$ and included in a first amplitude span, decreases when the voltage across its terminals is above a second threshold $V_{th-}$ and included in a second amplitude span and remains substantially constant when the voltage across its terminals exhibits an amplitude that is lower than the smaller of the two thresholds $V_{th-}$, $V_{th+}$.

8. The neural network of claim 7, wherein a post-synaptic pulse has an amplitude $V_P$ of negative polarity and that:

when said first threshold $V_{th+}$ is less than said second threshold $V_{th-}$, a pre-synaptic pulse has an amplitude $V_{PRE}$ of negative polarity, said pulses being configured so as to comply with the following two inequalities:

$|V_{PRE}-V_P|>|V_{th+}|$ and $|V_{PRE}-V_P|<|V_{th-}|$ $|V_P|>|V_{th-}|$ when said first threshold $V_{th+}$ is greater than said second threshold $V_{th-}$, a pre-synaptic pulse has an amplitude $V_{PRE}$ of positive polarity, said pulses being configured so as to comply with the following three inequalities:

$|V_{PRE}-V_P|>|V_{th+}|$ $|V_P|>|V_{th-}|$ and $|V_P|<|V_{th+}|$.

9. The neural network of claim 8, wherein the amplitude $V_{PRE}$ of the pre-synaptic pulse is substantially equal to the difference of said first and second thresholds $V_{th+}-V_{th-}$.

10. The neural network of claim 4, comprising feedback means linking the set of output neurons to the set of input neurons, said means being suitable for informing each input neuron of the activation of at least one output neuron.

11. The neural network of claim 10, further comprising means configured, when the integration threshold of an output neuron is exceeded, for deactivating the synapses directly connected to the other output neurons.

12. The neural network of claim 11, wherein said deactivation means comprise:

an OR logic gate linked on its first input to the output of an output neuron and on its second, complemented, input to the output of said feedback means, a field-effect transistor paired with each artificial synapse and mounted so that its drain is connected to the input terminal of said synapse, its source is connected to the communicating junction which links said synapse to an input neuron and its gate is connected to the output of said OR logic gate.

13. The neural network of claim 4, further comprising a diode mounted in series with each artificial synapse and configured so that said first and second thresholds $V_{th+}$, $V_{th-}$ are increased by the threshold voltage of the diode $V_d$.

14. The neural network of claim 4, wherein the memristive devices are of CBRAM, OXRAM, PCRAM or PCM type.

15. A method for detecting temporally correlated sequences in a data stream, wherein an asynchronous stream of pulses is generated on the basis of said data stream and produced as input to an artificial neural network implementing the learning method of claim 1, the activation of an output neuron corresponding to the detection of a sequence.

16. The use of the method of claim 15 to extract and classify temporally correlated sequences within audio, image, video or biological data.

\* \* \* \* \*